United States Patent [19]

Suzuki

[11] Patent Number: 4,895,756
[45] Date of Patent: Jan. 23, 1990

[54] PRINTED CIRCUIT SUBSTRATE

[75] Inventor: Hirosuke Suzuki, Saitama, Japan

[73] Assignee: Junkosha Co., Ltd., Japan

[21] Appl. No.: 248,158

[22] Filed: Sep. 23, 1988

[30] Foreign Application Priority Data

Nov. 20, 1987 [JP] Japan .................. 62-177167[U]

[51] Int. Cl.⁴ .............................................. B32B 5/22
[52] U.S. Cl. ............................ 428/317.9; 428/319.1;
428/323; 428/408; 428/422; 428/901; 361/397;
361/398; 174/68.5
[58] Field of Search ................. 428/317.9, 319.1, 422,
428/408, 323, 901; 361/397, 398; 174/68.5

[56] References Cited

U.S. PATENT DOCUMENTS

| 2,866,764 | 12/1958 | West | 428/422 |
| 3,107,197 | 10/1963 | Stein et al. | 428/422 |
| 4,429,216 | 1/1984 | Brigham | 428/87 |

FOREIGN PATENT DOCUMENTS 0257595  9/1985  Japan .
0864605  9/1981  U.S.S.R. .

Primary Examiner—Ellis P. Robinson
Assistant Examiner—P. J. Ryan
Attorney, Agent, or Firm—Mortenson & Uebler

[57] ABSTRACT

A printed circuit is provided wherein the electrically conductive material which forms the circuit elements is embedded within a dielectric substrate. The preferred dielectric substrate is porous, expanded polytetrafluoroethylene.

10 Claims, 1 Drawing Sheet

*Prior Art*

PRINTED CIRCUIT SUBSTRATE

BACKGROUND OF THE INVENTION

The present invention relates to a printed circuit substrate which is used in electrical circuits or optical circuits. Conventional circuitry of this type includes, for example, the substrate shown in FIG. 4. FIG. 4 is a cross-sectional view of one portion of a printed circuit substrate on which electrical circuits are formed.

Specifically, openings 2a, 2b are formed at prescribed positions in the printed circuit substrate 1', and a conductor 3, such as a copper foil, is printed onto the top and bottom surfaces of the printed circuit substrate 1' and interior surfaces of the holes 2a, 2b in accordance with the circuit wiring pattern as shown. This conductor 3 is formed by universally known printed wiring techniques such as, for example, etching and plating.

Furthermore, as shown in FIG. 4, a resistor 4 is connected to the printed circuit substrate 1' by lead wires 4a, 4b which are soldered into the aforementioned openings 2a, 2b. This resistor 4 forms a part of one of the electrical circuits.

However, in the abovementioned conventional circuitry, electrical circuits are formed by attaching circuit elements such as the aforementioned resistor 4 to the surface of the printed circuit substrate 1' after the aforementioned conductor 3 has been printed onto the substrate. As a result, unnecessary irregularities can be created on the surface of the printed circuit substrate 1' which interfere with the formation of a multilayer printed circuit board. Furthermore, there is a possibility that the printed circuit substrate 1' will be damaged by the heat generated by the soldering of the aforementioed lead wires. Moreover, in cases where soldering is insufficient, unsatisfactory electrical connections may result.

The present invention was conceived in light of the abovementioned problems encountered in conventional circuitry. The object of the present invention is to provide a printed circuit in which no unnecessary irregularities are created on the surface of the substrate, so that the formation of multilayer printed circuit boards is easily accomplished and in which unsatisfactory electrical connections are minimized.

SUMMARY OF THE INVENTION

A printed circuit is provided comprising conductive material which forms circuit elements embedded within dielectric substrate. The conductive material may be a low-conductivity material which forms a resistor or a high-dielectric constant material which forms a capacitor. The conductive material may be a material having high magnetic permeability. The dielectric substrate preferably is a porous dielectric material, more preferably a continuously porous dielectric material and most preferably porous, expanded polytetrafluoroethylene. The conductive material may be electrically conductive or light conducting. The conductive material may be impregnated within the dielectric substrate.

DETAILED DESCRIPTION OF THE INVENTION AND PREFERRED EMBODIMENTS WITH REFERENCE TO THE DRAWINGS

A printed circuit is provided wherein the electrically conductive material which forms the circuit elements is embedded within a dielectric substrate. The preferred dielectric substrate is porous, expanded polytetrafluoroethylene.

Specifically, in the printed circuit substrate of the present invention, materials which form circuit elements are contained inside a dielectric substrate. The term "printed circuit substrate" is used herein as a general term for substrates used for the printed wiring of electrical circuits and optical circuits, and includes, for example, substrates which are generally referred to as printed wiring boards, printed circuit boards of printed wiring substrates.

In the printed circuit of the present invention, materials which form circuit elements are contained inside the substrate. Since required circuit elements are formed using these materials, no unnecessary irregularities are created on the surface of the printed circuit substrate. Furthermore, since there is no need to attach circuit elements after assembly, unsatisfactory electrical connection due to faulty soldering are minimized. Moreover, desired circuits can be formed merely by laminating a multiple number of substrates together.

Examples of application of the present invention will be described with reference to the accompanying drawings.

Figure 1:
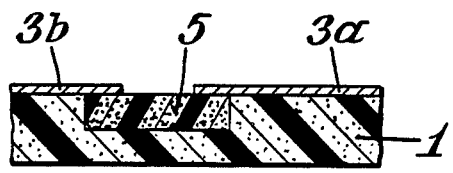
FIG. 1 is a cross-sectional view of one embodiment of the printed circuit according to the present invention.

FIG. 1 illustrates one example of the present invention. Specifically, there is a printed circuit substrate 1 which contains a low-conductivity material 5, such a polytetrafluoroethylene filled with carbon black, that forms a resistor in an electrical circuit. This material 5 is contained so that it is partially exposed at the surface of the substrate 1. Conductors 3a, 3b, consisting of copper foil, are printed on the surface of the printed circuit substrate 1 so that the conductors separately contact the aforementioned low-conductivity material 5. These conductors 3a, 3b are printed by a universally known wiring technique such as etching or plating in the same manner as in the abovementioned conventional technology.

The dielectric which makes up the printed circuit substrate 1 is preferably formed from expanded, porous polytetrafluoroethylene, which is a continuously porous material, and the printed circuit substrate 1 can be impregnated with the aforementioned low-conductivity material 5, so that this material is contained inside the pores of the substrate. Furthermore, the impregnation of the substate with the abovementioned low-conductivity material 5 can be promoted by pre-impregnating the target region, where the low-conductivity material 5 is to be installed, with a solvent used for substitution purposes. The low-conductivity material 5 thereby forms a resistor, and the conductors 3a, 3b form lead wires, thereby completing one portion of the electrical circuit according to the invention.

As a result of this structure, no unnecessary irregularities are formed on the surface of the printed circuit substrate 1. Accordingly, a multilayer printed circuit board can easily be formed. Furthermore, since there are no connections depending on weak lead wires or soldered connections of relatively low durability, there is less of a tendency for the circuit board to be damaged by external shocks and vibrations. Furthermore, the printed circuit board is not damaged by the heat of soldering, and unsatisfactory electrical connections due to faulty soldering are eliminated.

Figure 2:
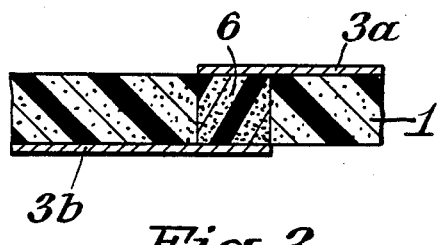
FIG. 2 is a cross-sectional view of another embodiment wherein conductive material forms a capacitor in the printed circuit.

FIG. 2 illustrates a second example of the present invention. In this example, a high-dielectric constant material 6, such as polytetrafluoroethylene tape filled with $TiO_2$ or $BaTiO_3$ powder, which forms a capacitor, is contained in the printed circuit substrate 1 so that said material 6 is exposed at the top and bottom surfaces of the printed circuit substrate 1. Conductors 3a, 3b are printed by the same method as in the aforementioned first example, so that these conductors separately contact the top and bottom surfaces of the high-dielectric constant material 6. The structure and effects are substantially the same as in the aforementioned first example.

Figure 3:
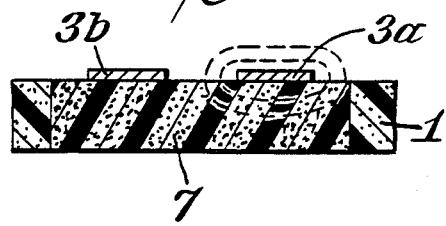
FIG. 3 is a cross-sectional view of a still further embodiment wherein a material having high magnetic permeability is embedded within he dielectric substrate.
Figure 4:
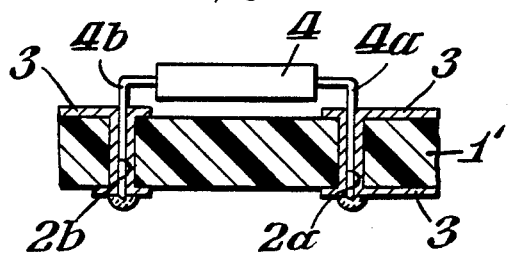
FIG. 4 is a cross-sectional view of a known printed circuit.

FIG. 3 illustrates a third example of the present invention. In this example, a high-magnetic-permeable material 7, such as polytetrafluoroethylene tape filled with molybdenum permalloy powder, is contained inside the printed circuit substrate 1, and conductors 3'a, 3b are wired parallel to each other on the surface of the printed circuit substrate 1.

For example, the lines of magnetic force generated when a current flows through conductor 3a, indicated by the dashed lines in FIG. 3, tend not to reach conductor 3b as a result of the shielding effect of the high-magnetic-permeable material 7. As a result, almost no current flows through conductor 3b. Furthermore, a similar effect is also obtained when a current flows through conductor 3b. The remaining structure and effects are substantially the same as in the aforementioned first example of application.

In the abovementioned examples, the material used to form the printed circuit substrate was expanded, porous polytetrafluoroethylene. However, the material used for the substrate is not limited to this material. For example, a porous dielectric such as porous polyester could also be used.

Circuit elements which are attached after assembly as in conventional circuitry can be utilized together with the present invention. In addition, materials for optical circuits can also be contained inside the printed circuit substrate.

Examples of circuit formation using a single substrate 1 were described above. However, it would also be possible to form circuits on substrates installed above or below the abovementioned substrate of the present invention, or jointly with substrates installed above and/or below the above-mentioned substrate of the present invention.

In the present invention, as was described above, materials which form electrical circuits are contained inside a printed circuit substrate. Accordingly, no unnecessary irregularities are created on the surface of the printed circuit substrate, and multilayer printed circuit boards can therefore easily be manufactured. Furthermore, since there are no connections depending on weak lead wires or soldered connections of relatively low durability, the printed circuit board is resistant to damage caused by external shocks and vibrations. Printed circuit substrate damage caused by the heat of soldering is eliminated, as are unsatisfactory electrical connections due to faulty soldering.

While the invention has been disclosed herein in connection with certain embodiments and detailed descriptions, it will be clear to one skilled in the art that modifications or variations of such details can be made without deviating from the gist of this invention, and such modifications or variations are considered to be within the scope of the claims hereinbelow.

What is claimed is:

1. A printed circuit comprising electrically conductive material which forms circuit elements contained within the pores of a porous dielectric substrate.

2. The circuit of claim 1 wherein said conductive material is a low-conductivity material which forms a resistor.

3. The circuit of claim 1 wherein said conductive material is a high-dielectric constant material which forms a capacitor.

4. The circuit of claim 1 wherein said conductive material is a material having high magnetic permeability.

5. The printed circuit of claim 1 wherein said dielectric substrate is a porous dielectric material.

6. The printed circuit of claim 5 wherein said dielectric substrate is a porous dielectric material having continuous pores therethrough.

7. The printed circuit of claim 5 wherein said dielectric substrate is porous, expanded polytetrafluoroethylene.

8. The printed circuit of claim 1 wherein said conductive material is electrically conductive.

9. The printed circuit of claim 1 wherein said conductive material is light conducting.

10. The circuit of claim 1 wherein said conductive material is impregnated within said dielectric substrate.

* * * * *